(12) United States Patent
Nguyen et al.

(10) Patent No.: US 12,032,000 B2
(45) Date of Patent: Jul. 9, 2024

(54) TEST SOCKET ASSEMBLIES WITH LIQUID COOLED FRAME FOR SEMICONDUCTOR INTEGRATED CIRCUITS

(71) Applicant: Smiths Interconnect Americas, Inc., Kansas City, KS (US)

(72) Inventors: Quynh Ngoc Nguyen, Fremont, CA (US); James Edward Spooner, Manteca, CA (US)

(73) Assignee: SMITHS INTERCONNECT AMERICAS, INC., Kansas City, KS (US)

(*) Notice: Subject to any disclaimer, the term of this patent is extended or adjusted under 35 U.S.C. 154(b) by 145 days.

(21) Appl. No.: 17/886,754

(22) Filed: Aug. 12, 2022

(65) Prior Publication Data

US 2023/0047762 A1    Feb. 16, 2023

Related U.S. Application Data

(60) Provisional application No. 63/232,981, filed on Aug. 13, 2021.

(51) Int. Cl.
*G01R 31/28* (2006.01)
*G01R 1/04* (2006.01)

(52) U.S. Cl.
CPC ....... *G01R 1/0458* (2013.01); *G01R 31/2877* (2013.01)

(58) Field of Classification Search
CPC ............ G01R 31/2831; G01R 31/2874; G01R 31/2877
See application file for complete search history.

(56) References Cited

U.S. PATENT DOCUMENTS

| | | | |
|---|---|---|---|
| 5,329,419 A | 7/1994 | Umezawa | |
| 6,282,095 B1 * | 8/2001 | Houghton | ............ H05K 9/0039 174/16.3 |
| 7,138,811 B1 * | 11/2006 | Mahoney | ........... G01R 31/2889 324/762.02 |
| 7,304,380 B2 | 12/2007 | Farrar et al. | |
| 8,587,943 B2 | 11/2013 | Barina et al. | |
| 8,638,559 B2 | 1/2014 | Barina et al. | |
| 8,767,403 B2 | 7/2014 | Rau et al. | |
| 10,499,488 B1 | 12/2019 | Tsai et al. | |

* cited by examiner

Primary Examiner — Tung X Nguyen
(74) Attorney, Agent, or Firm — Armstrong Teasdale LLP

(57) ABSTRACT

A socket assembly with liquid cooling frame for a semiconductor integrated circuit (IC) chip is provided. The socket assembly includes a liquid cooling socket frame including a metallic frame body defining an opening sized to receive the semiconductor IC chip, wherein the frame body includes one or more channels transversely positioned through the frame body and positioned in an interior of the frame body, the channels defining a fluid path. The socket assembly also includes a socket cartridge including a metallic cartridge body defining a plurality of cavities each sized to receive a test probe therein, the socket frame covering a portion of the socket cartridge and exposing the plurality of cavities at the opening.

17 Claims, 8 Drawing Sheets

TEST SOCKET ASSEMBLIES WITH LIQUID COOLED FRAME FOR SEMICONDUCTOR INTEGRATED CIRCUITS

CROSS REFERENCE TO RELATED APPLICATIONS

This application claims the benefit of U.S. Provisional Application Ser. No. 63/232,981 filed Aug. 13, 2021, the entire disclosure of which is hereby incorporated by reference in its entirety.

FIELD

The field of the disclosure relates generally to a test socket for semiconductor integrated circuits and, more specifically, a test socket assembly with liquid cooled frame for testing semiconductor integrated circuit (IC) chips.

BACKGROUND

Semiconductor integrated circuit (IC) chips are produced in various packages, or chip configurations, and are produced in large quantities. Production of IC chips generally includes testing of the IC chips in a manner that simulates an end-user's application of those IC chips. One manner of testing IC chips is to connect each IC chip through a test socket assembly to a printed circuit board (PCB), or load board, that exercises various functionalities of the IC chip. The test socket assembly can be re-used to test many IC chips.

Known test socket assemblies are disadvantaged in some aspects and improvements are desired.

BRIEF DESCRIPTION

In one aspect, a socket assembly for a semiconductor integrated circuit (IC) chip is provided. The socket assembly includes a socket frame including a metallic frame body defining an opening sized to receive the semiconductor IC chip, wherein the frame body includes one or more channels transversely positioned through the frame body and positioned in an interior of the frame body, the channels defining a fluid path. The socket assembly also includes a socket cartridge including a metallic cartridge body defining a plurality of cavities each sized to receive a test probe therein, the socket frame covering a portion of the socket cartridge and exposing the plurality of cavities at the opening.

In another a method of assembling a socket assembly for a semiconductor integrated circuit IC chip is provided. The method includes forming a socket frame including a metallic frame body that defines an opening sized to receive the semiconductor IC chip, wherein the frame body includes one or more channels transversely positioned through the frame body and positioned in an interior of the frame body, the channels defining a fluid path. The method also includes forming a socket cartridge including a metallic cartridge body that defines a plurality of cavities each sized to receive a test probe therein, and mounting the socket frame on the socket cartridge by covering a portion of the socket cartridge and exposing the plurality of cavities at the opening.

DETAILED DESCRIPTION

The disclosure includes test socket assemblies and methods of improving heat transfer for test systems of semiconductor integrated circuit (IC) chips and socket assemblies by incorporating liquid cooling in socket assemblies.

Consumer demands for next generation technologies such as high speed gaming, computer graphics, Internet of things (IoT), 5G, artificial intelligence (AI), deep learning, vehicle-to-vehicle communication, and self-driving vehicle create a need for high speed data transfer and processing technologies. High reliability testing is essential for the high speed, multi-function devices.

In testing IC chips, a fundamental component of a test system that enables testing of the IC chips is a test socket assembly for the IC chips that can be re-used many times to test large quantities of the IC chips. The test socket assembly connects, both electrically and mechanically, the IC chip to a printed circuit board (PCB) or a load board. The degree to which the test socket assembly can be re-used is quantified by how many "cycles" it can withstand without degrading performance, e.g., signal performance. Each time an IC chip is inserted, or set, into the test socket assembly is referred to as one cycle. Generally, over the course of many cycles, electrical and mechanical properties of the contacts and structures of the test socket assembly begin to degrade. One cause of the degradation is repeated heating and deformation of the test socket assemblies from the heat generated by the IC chips during the testing, especially high performing IC chips. Such degradation eventually impacts integrity of the testing itself, at which point the test socket assembly reaches the end of its useful life.

Figure 1:
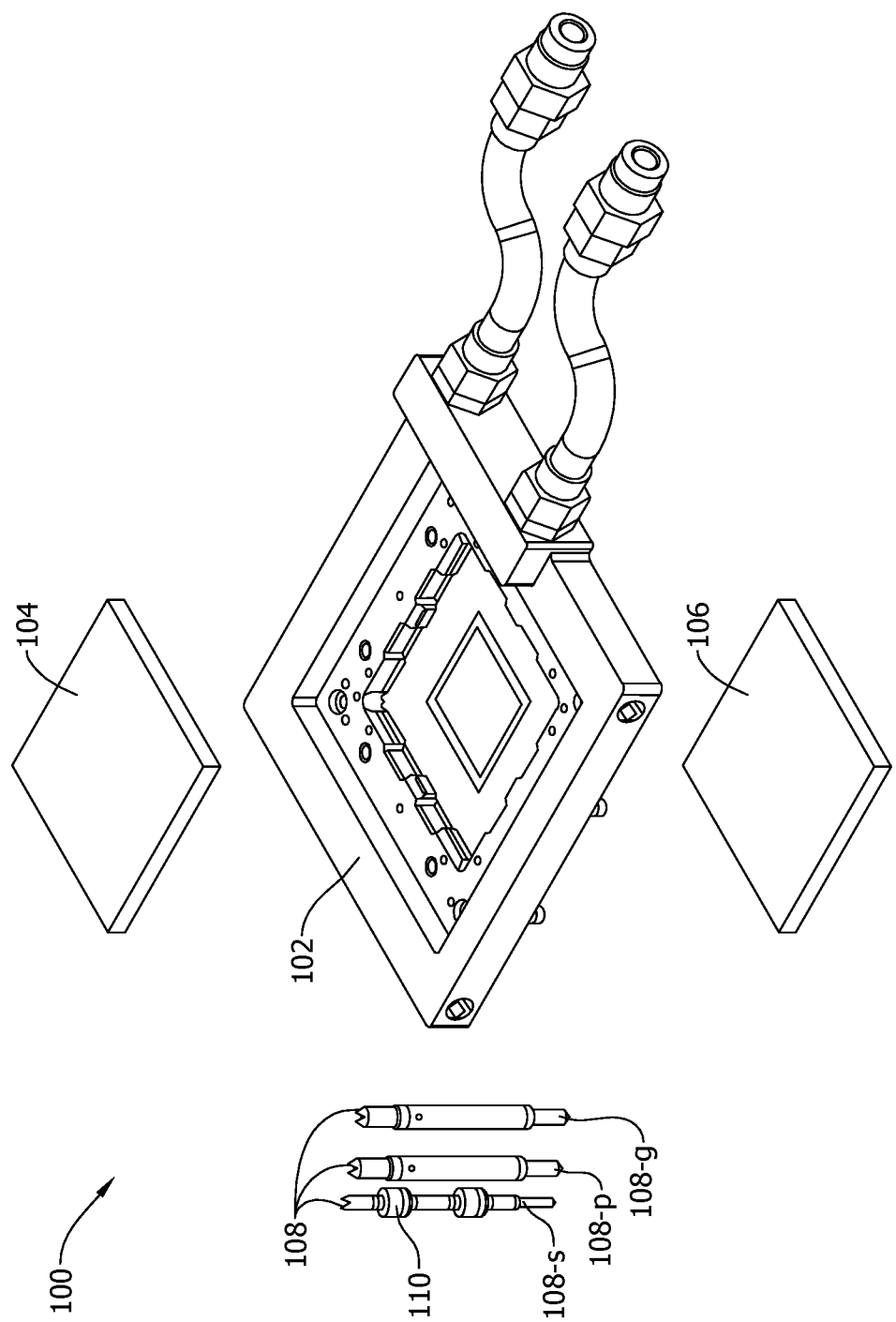
FIG. 1 is an exploded view of a schematic diagram of an example test system.

FIG. 1 is an exploded view of a schematic diagram of an exemplary test system 100 that includes an exemplary socket assembly 102, a semiconductor IC chip 104, and a PCB 106. The IC chip 104 is to be tested. The PCB 106 includes test circuits. The socket assembly 102 provides electrical and mechanical connection between the IC chip 104 and the PCB 106. The test system 100 further include a plurality of probes 108. The probes 108 may include a ground probe 108-$g$, a signal probe 108-$s$, and a power probe 108-$p$. The probes 108 are placed in the socket assembly 102 and used to establish electrical connections between the IC chip 104 and PCB 106. Specifically, the ground probe 108-$g$ is connected to the ground. The signal probe 108-$s$ transmits signals between the IC chip 104 and the PCB 106. The power probe 108-$p$ is configured to be connected to a power supply. Power, grounding, and signals are provided through the probes 108 from the PCB board 106 to the IC chip 104.

In operation, the socket assembly 102 is mounted on the PCB. To test the IC chip 104, the IC chip 104 is received in the socket assembly 102 and the PCB 106 is placed within a test system.

The socket assembly 102 serves as a re-usable interface for connecting many IC chips 104 to the PCB 106. The high performance, e.g., high speeds, of the IC chip 104 generates a large amount of heat. For example, the rate of heat transferred by a 63 mm×95 mm IC chip may reach 1.2 kw. The socket assembly 102 needs to maintain high reliability without being adversely affected or overheated by the amount of heat generated during testing of the IC chip 104.

Conventional socket frames for a socket assembly are fabricated from plastic, a thermally-nonconductive material. In such implementations the IC chip is cooled by heat transfer through a heat sink in contact with the IC chip top surface, the surface of the IC chip that faces away from the test socket assembly. This cooling mechanism is effective in removing heat away from the IC chip top surface. However, as performance of IC chips increases, new issue arises, where high heat is generated at contact points between the IC chip and the test socket assembly such as contact points between the IC chip and the probes. The high heat at the contact points is on the bottom side of the IC chip, which is the surface opposite the IC chip top surface and facing toward the test socket assembly. Heat sinks placed on the IC chip top surface are no longer sufficient or have increased difficulties in dissipating the high heat generated at the contact points. Dissipating that much heat efficiently and effectively is, therefore, a new problem in reliably testing high-performing IC chips.

The high heat generated at the contact points degrades the performance and life of the test socket assembly. With repeated use of the socket assembly 102 to test many IC chips 104, the large amount of heat deforms the socket assembly, affecting the electrical performance of conventional test systems and causing the conventional test system unable to transmit high-frequency signals. As a result, conventional test systems having plastic socket frames do not last long and have an unsatisfactory performance, especially as to high-frequency signals. Further, because the socket frame of the conventional socket assemblies are fabricated from thermally-nonconductive material, it would be pointless to include a liquid cooling path inside the socket frame. In other words, solution to heat dissipation by including a cooling fluid path and using liquid cooling in a metallic socket frame in the systems and methods disclosed herein would have been inapplicable to the conventional socket assemblies and test systems.

The socket assemblies 102 with liquid-cooled frames 202 as disclosed herein are intended to keep the test socket assembly 102 cool by removing the heat from the contact points between the test socket assembly 102 and the IC chip 104, thereby improving life of test sockets, reducing maintenance, and ultimately reducing down time of the test system 100.

Figure 2A:
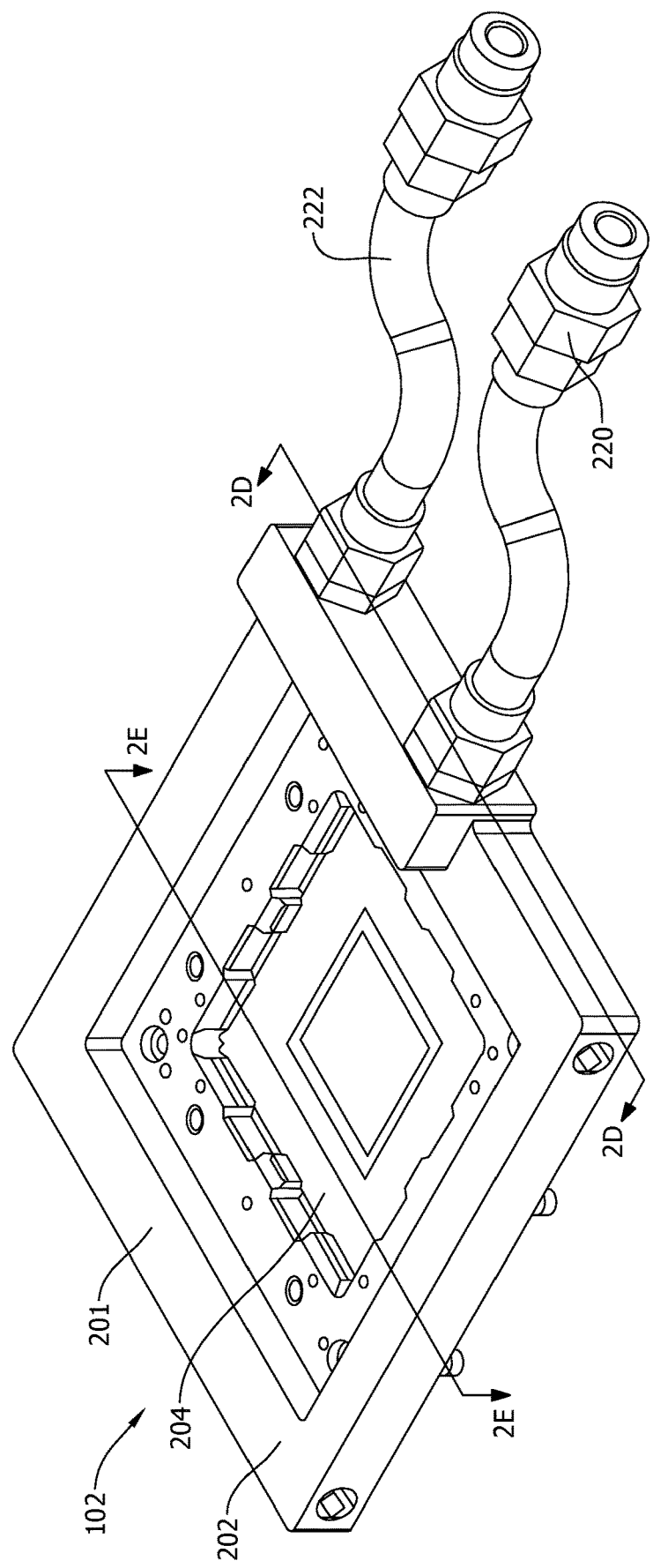
FIG. 2A is a top perspective view of an example socket assembly in the test system shown in FIG. 1.
Figure 2B:
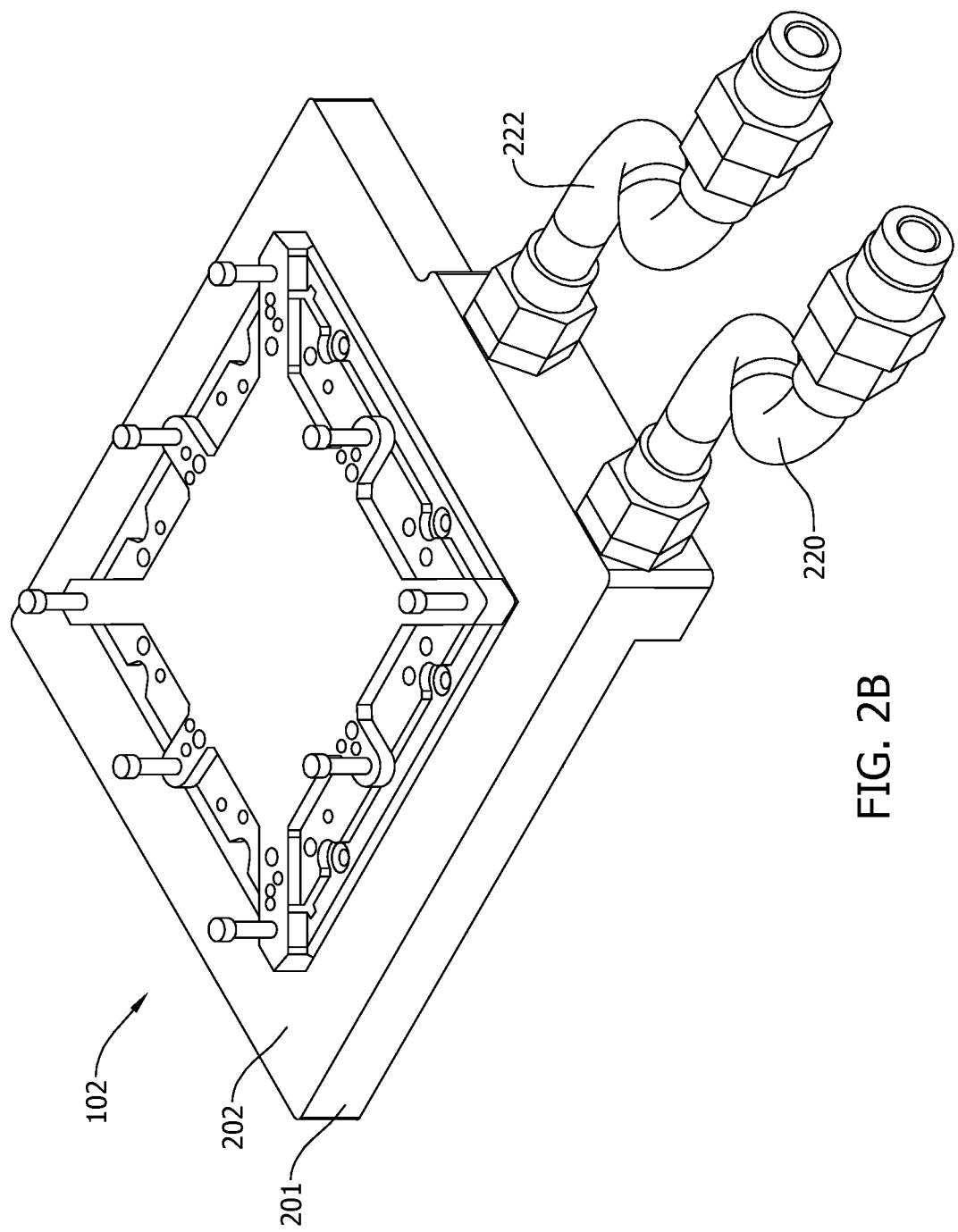
FIG. 2B is a bottom perspective view of the socket assembly shown in FIG. 2A.
Figure 2C:
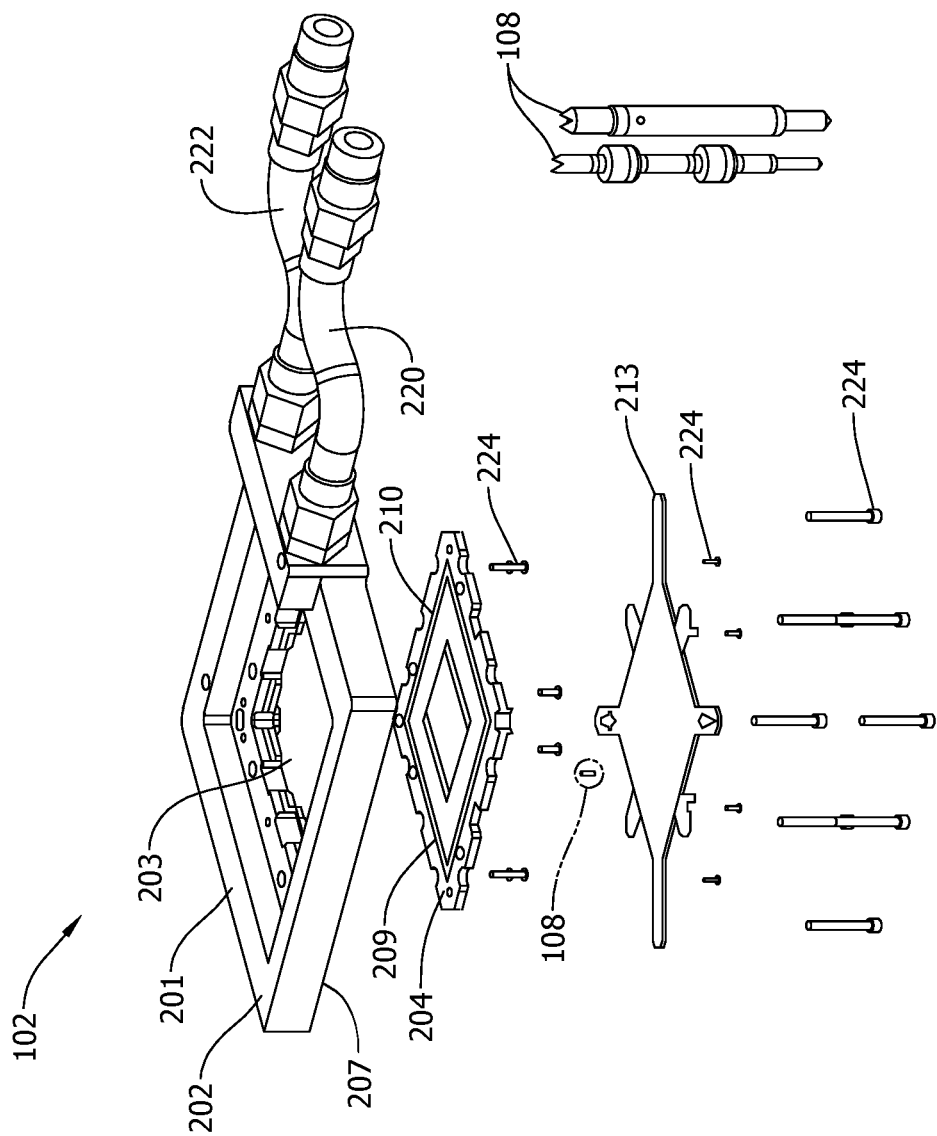
FIG. 2C is an exploded view of the socket assembly shown in FIG. 2A.
Figure 2D:
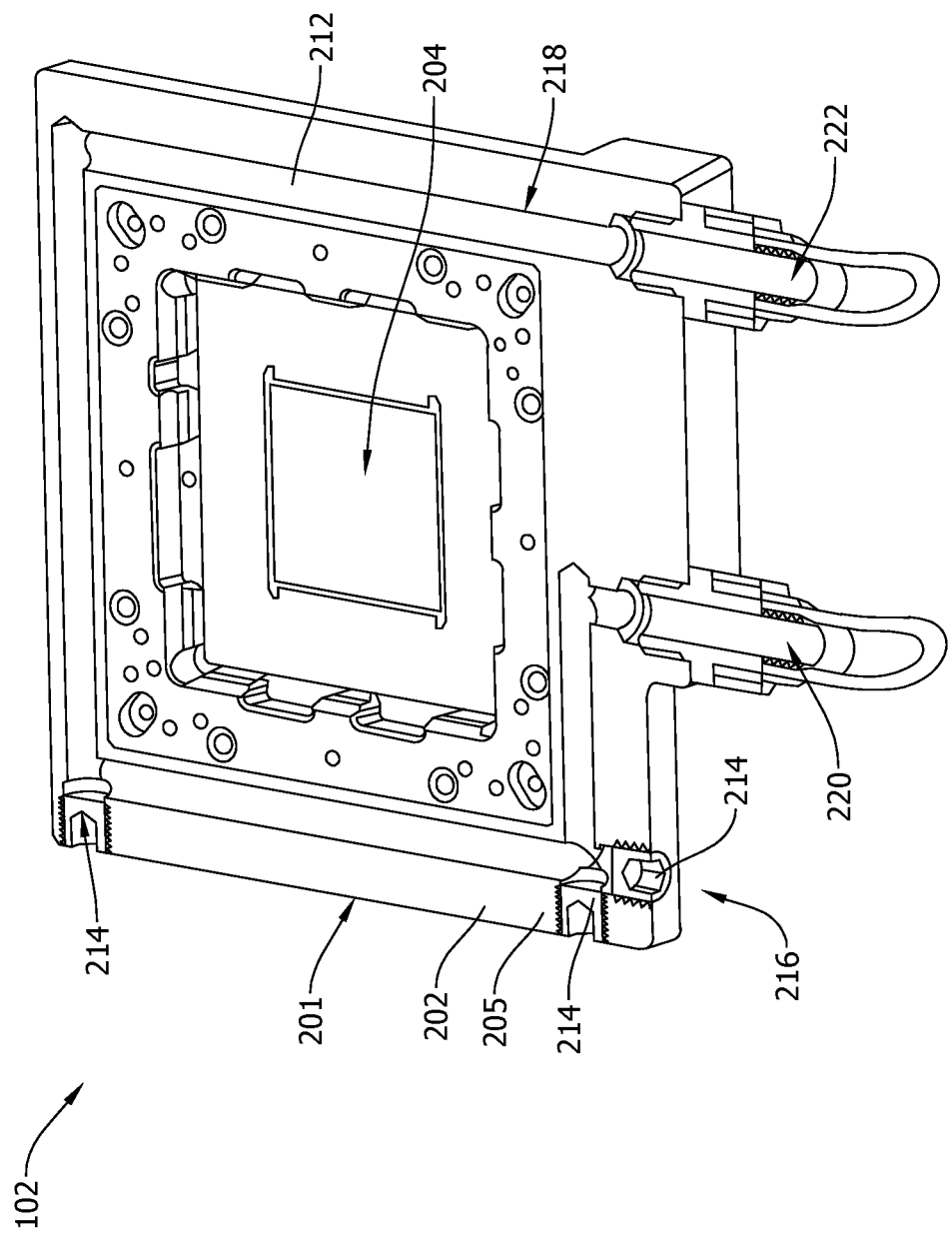
FIG. 2D is a cross-sectional view of the socket assembly shown in FIG. 2A along line 2D-2D as marked in FIG. 2A.
Figure 2E:
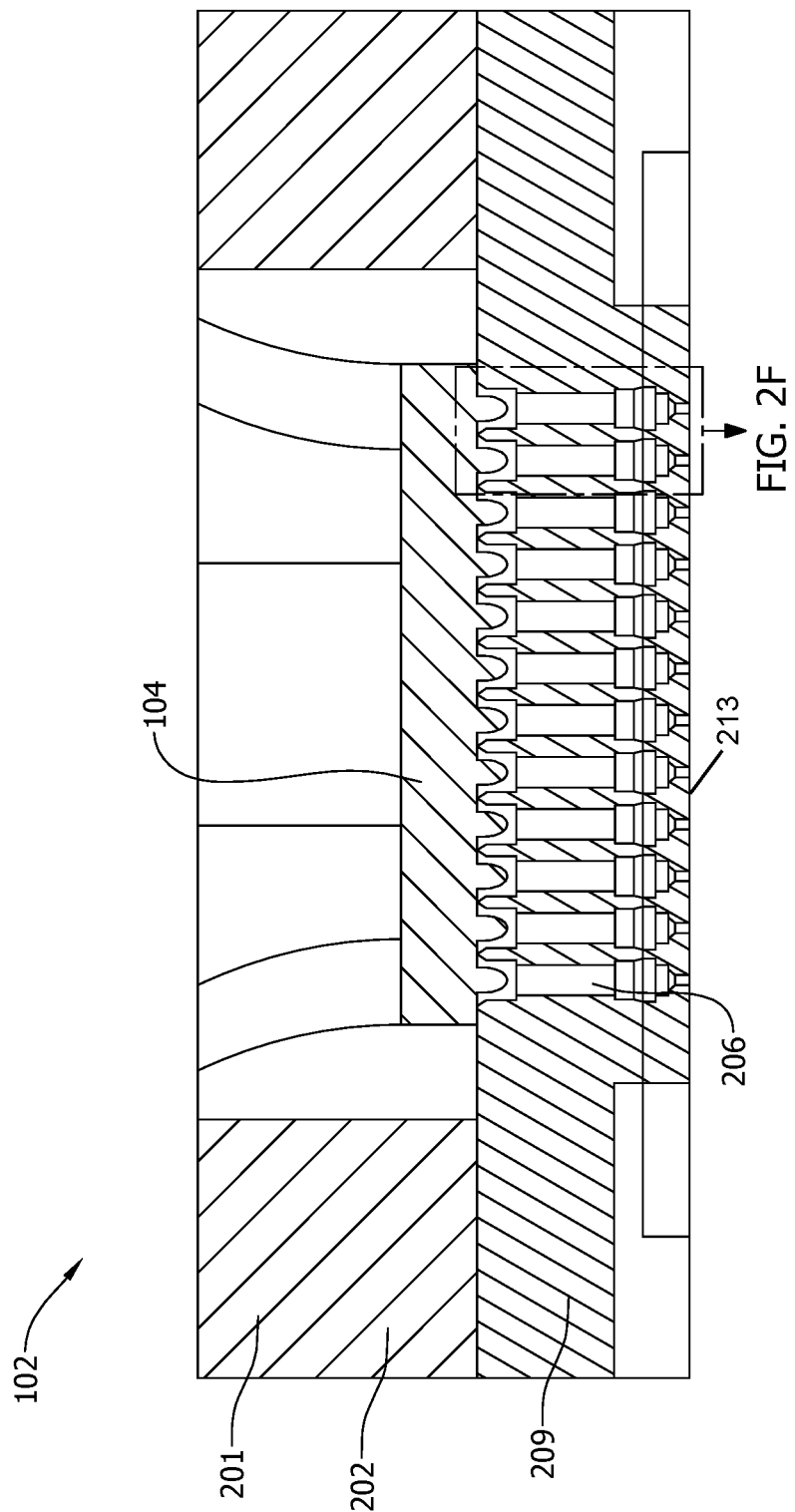
FIG. 2E is a cross-sectional view of the socket assembly shown in FIG. 2A along line 2E-2E as marked in FIG. 2A.
Figure 2F:
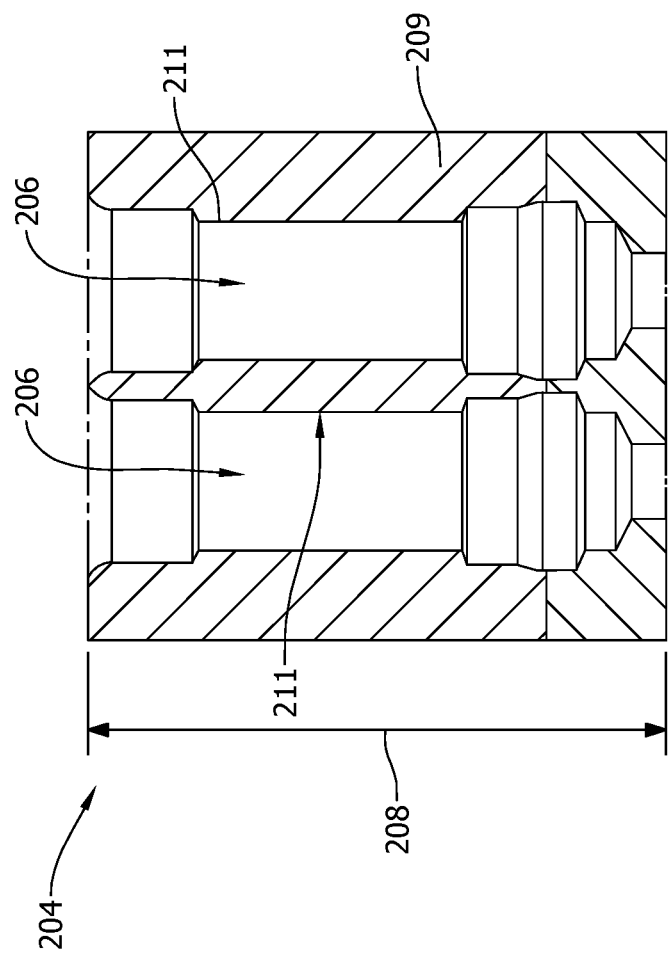
FIG. 2F is an enlarge view of a portion of the socket assembly shown in FIG. 2E.

FIGS. 2A-2D show various views of the exemplary socket assembly 102. FIG. 2A is a top perspective view of the socket assembly 102. FIG. 2B is a bottom perspective view of the socket assembly 102. FIG. 2C is an exploded view of the socket assembly 102 with probes 108, where an enlarged view of the probes 108 is also included. FIG. 2D is a cross-sectional view of the socket assembly 102 along line 2D-2D as marked in FIG. 2A. FIG. 2E is a cross-sectional view of the socket assembly 102 along line 2E-2E as marked in FIG. 2A with the IC chip 104 placed in the socket assembly 102. FIG. 2F is an enlarged view of a portion of the socket assembly 102 shown in FIG. 2E.

In the exemplary embodiment, the socket assembly 102 includes a socket frame 202 and a socket cartridge 204. In the depicted embodiment, the socket frame 202 and the socket cartridge 204 are separated pieces (see FIG. 2C). In some embodiments, the socket frame 202 and the socket cartridge 204 are fabricated as one single piece (i.e., only one piece).

In the exemplary embodiment, the socket frame 202 includes a frame body 201 (FIG. 2D). The frame body 201 defines an opening 203 (FIGS. 2C and 2D) sized to receive the IC chip 104 therein. The frame body 201 is metallic or is fabricated from metal, such as, but not limited to, aluminum, magnesium, titanium, zirconium, copper, iron, and/or an alloy thereof, such as aluminum 5053. The metallic frame body 201 improves heat transfer. The socket frame 202 may further include an insulation layer 205 (FIG. 2D) positioned at the surface of the frame body 201. The insulation layer 205 of the socket frame 202 may be an anodic film, such as aluminum oxide, that is generated on the metal by an anodizing process and is electrically non-conductive. The insulation layer may be coated with a polytetrafluoroethylene (PTFE) coating. In some embodiments, parts of the frame body 201 do not include the insulation layer. For example, a side 207 or part of the side 207 of the frame body 201 (FIG. 2C) that faces and mates with the socket cartridge 204 does not have the insulation layer 205 by removing the insulation layer 205 or not being coated with the insulation layer 205. Without the insulation layer at the side 207, the thermal transmission between the socket frame 202 and other parts of the test system 100 such as the socket cartridge 204 and the IC chip 104 is improved. The remaining surface of the socket frame 202 is coated with the insulation layer 205 to prevent short-circuiting.

In the exemplary embodiment, the socket cartridge 204 includes a cartridge body 209 (FIGS. 2C-2F). The cartridge body 209 is metallic or is fabricated from metal, such as, but not limited to, aluminum, magnesium, titanium, zirconium, copper, iron, and/or an alloy thereof. The metallic cartridge body 209 improves heat transfer. The cartridge body 209 and the frame body 201 may be fabricated from different types of metal or alloy. The cartridge body 209 defines a plurality of cavities 206 disposed through the thickness 208 of the socket cartridge 204 (FIG. 2F). Each of the cavity 206 is sized to receive a probe 108 therein. The cavity 206 may be a ground cavity 206 configured to receive a ground probe 108-g therein (see FIG. 1). The cavity 206 may be a signal cavity 206, which is configured to receive a signal probe 108-s therein. The cavity 206 may also be a power cavity 206, which is configured to receive a power probe 108-p therein. The socket cartridge 204 includes an insulation layer 211 along the surface of the cavities 206. The insulation layer 211 may be an anodic film, such as aluminum oxide, which is generated on the metal by an anodizing process and is electrically non-conductive. The insulation layer may be coated with a polytetrafluoroethylene (PTFE) coating. The insulation layer 211 prevents the probes 108 from contacting each other to avoid an electrical short and prevents the probes 108 from contacting the metal cartridge 204. In some embodiments, the ground cavity 206 does not have the insulation layer 211 and/or conductive material such as gold, copper, nickel, or other conductive material not easily oxidized is applied to the surface of the ground cavity 206 such that oxidation between the ground probe 108-g and the cartridge body 209 is discouraged, improving the electrical performance of the test system 100 and thermal conductivity of the test system 100. In some embodiments, the signal probe 108-s includes an insulation ring 110 (see FIG. 1). The signal cavity 206 may not include an insulation layer 211, also improving the thermal performance of the test system 100 without the signal probe 108-s being electrically contacted with the cartridge 204. In other embodiments, a side 210 (FIG. 2C) of the cartridge body 209 does not have the insulation layer 211 by removing the insulation layer 211 or not being coated with the insulation layer 211, improving the thermal performance of the test system 100. When assembling the cartridge 204 with the socket frame 202, the side 210 of the cartridge 204 and the side 207 of the socket frame 202 face one another. In some embodiments, thermal grease or thermal paste (not shown) may be applied to the side 207 of the socket frame 202, the side 210 of the socket cartridge 204, or both. The thermal grease eliminates air gaps or spaces, which acts as thermal insulation, between the sides 207, 210, thereby improving heat transfer and dissipation.

In the exemplary embodiment, the cartridge 204 further includes a cartridge bottom 213 (FIGS. 2C and 2E) used to retain probes 108 in place. The cavities 206 are provided through the cartridge bottom 213 for probes 108 to be placed in the cavities 206 and to be electrically connected with the PCB board 106. Cavities 206 for signal probes 108-s include insulation material, similar to the insulation ring 110.

To assemble the socket assembly 102, the socket frame 202 is placed over the socket cartridge 204 such that the opening 203 of the socket frame 202 exposes the cavities 206 of the socket cartridge 204 for probes 108 to be placed in the cavities 206 and for the IC chip 104 to be placed in the opening 203 and be electrically connected with the probes 108. The socket frame 202 and the socket cartridge 204 may be coupled together through a fastener 224, such as screws, nuts, or bolts.

With the application of metallic socket frame body 201 and metallic cartridge body 209 and mechanisms of improving heat transfer as described above, the socket frame 202 and cartridge 204 do not sufficiently dissipate the large amount of heat generated by operation of high functioning IC chips 104 during testing, especially the high heat generated at the contact points between the IC chips 104 and the probes 108. If not dissipated, the high heat generated at the contact points would degrade the life and performance of the socket assembly 102. Additional heat sinks conventionally are attached to the IC chip 104 or the socket assembly 102, but do not effectively dissipate the high heat generated at the contact points. The socket assemblies disclosed herein incorporate fluid cooling, e.g., liquid cooling. In the exemplary embodiment, the socket frame 202 defines one or more channels 212 (FIG. 2D). The channels 212 may be formed by drilling into the frame body 201 starting from the exterior of the frame body 201. The socket assembly 102 may further include one or more plugs 214 to prevent fluid from coming out from the drill entries 216. Alternatively, the channels 212 may be formed in the frame body 201 by a metal manufacturing process, such as deforming or casting, during the manufacturing of the frame body 201. The one or more channels 212 are positioned in the interior of the frame body 201 and transversely positioned through the frame body 201. The channels 212 are joined together and in fluid communication with one another. The channels 212 define a fluid path 218 for a cooling fluid to be circulated in. The socket assembly 102 further includes an inlet 220 and an outlet 222. The inlet 220 and the outlet 222 may form any angle with the frame 202. The inlet 220 is coupled to the frame body 201 at the beginning of the fluid path 218. The outlet 222 is coupled to the frame body at the end of the fluid path 218.

As such, cooling fluid goes into the frame body 201 through the inlet 220, and comes out of the frame body 201 through the outlet 222, carrying heat out of the socket frame 202. The cooling fluid may be a mixture of water with ethylene glycol or propylene glycol, or other cooling fluid that improves heat transfer. The flow rate of the cooling fluid is determined by the cooling need of the test system 100 and may be adjusted by the cooling system (not shown) coupled to the inlet 220 and the outlet 222.

In operation, the socket assembly 102 is connected with a cooling system through the inlet 220 and the outlet 222. The cooling system circulates the cooling fluid and cools down the socket assembly 102 and the test system 100.

In the exemplary embodiment, the frame body 201 of the socket frame 202 and the cartridge body 209 of the cartridge 204 are metallic and thermally conductive. Heat generated from the IC chip 104, the probes 108, and the PCB 106 are transmitted to the socket frame 202 and the cartridge 204, which then transfer the heat out to ambient environment and out through the cooling fluid circulating in the fluid path. As a result, heat is effectively dissipated, and the performance of the IC chip 104 and the socket assembly 102 remain consistent and unaffected by the large amount of heat and repeated use.

Figure 3:
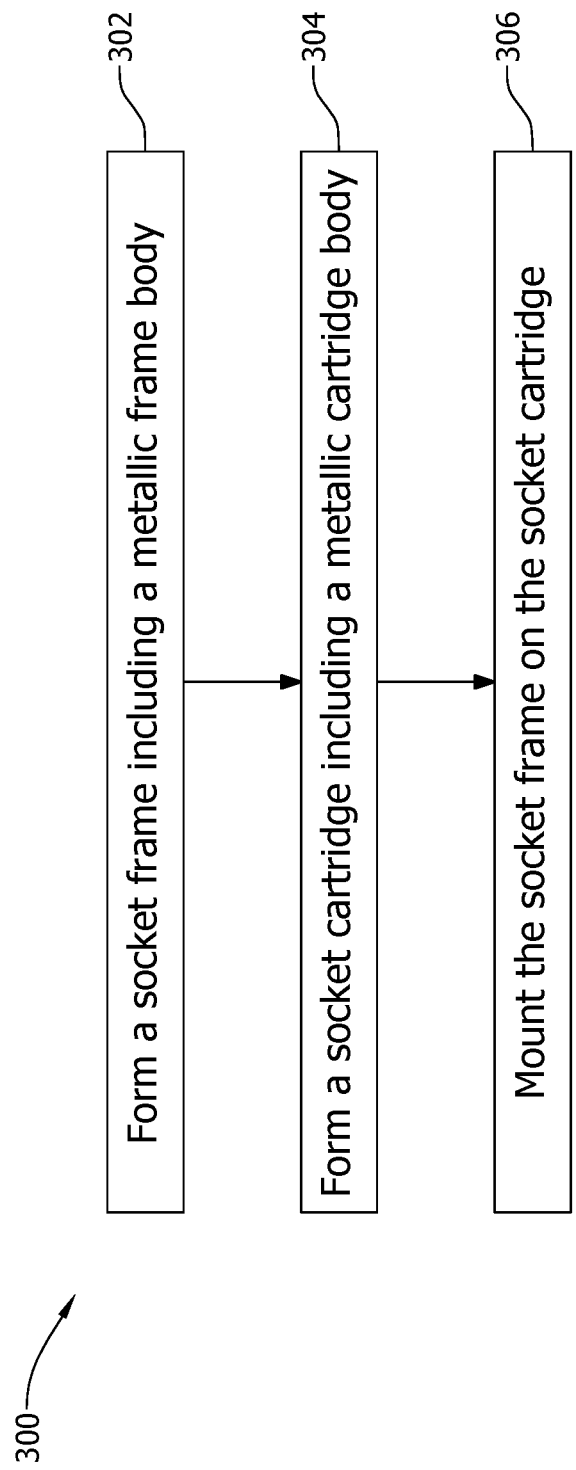
FIG. 3 is a flow diagram of a method of assembling the socket assembly shown in FIGS. 1-2F.

FIG. 3 is a flow chart of an exemplary method 300 of assembling a socket assembly for an IC chip. The socket assembly may be the socket assembly 102 disclosed above. The method 300 includes forming 302 a socket frame including a metallic frame body that defines an opening sized to receive the IC chip. The frame body includes one or more channels transversely positioned through the frame body and positioned in the interior of the frame body. The channels define a fluid path. The method 300 further includes forming 304 a socket cartridge including a metallic cartridge body that defines a plurality of cavities each sized to receive a test probe therein. The method 300 also includes mounting 306 the socket frame on the socket cartridge by covering a portion of the socket cartridge and exposing the plurality of cavities at the opening.

The technical effects of the systems and apparatuses described herein may include: (a) improving heat transfer by including a fluid path in the metallic socket frame body for circulating cooling fluid; (b) improving heat transfer through the socket frame and the cartridge that are manufactured as one single piece; (c) improving heat transfer by removing the insulation layer at portions of the socket assembly without compromising the electrical performance of the test system.

In the foregoing specification and the claims that follow, a number of terms are referenced that have the following meanings.

As used herein, an element or step recited in the singular and preceded with the word "a" or "an" should be understood as not excluding plural elements or steps, unless such exclusion is explicitly recited. Furthermore, references to "example implementation" or "one implementation" of the present disclosure are not intended to be interpreted as excluding the existence of additional implementations that also incorporate the recited features.

"Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here, and throughout the specification and claims, range limitations may be combined or interchanged. Such ranges are identified and include all the sub-ranges contained therein unless context or language indicates otherwise.

Disjunctive language such as the phrase "at least one of X, Y, or Z," unless specifically stated otherwise, is generally understood within the context as used to state that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present. Additionally, conjunctive language such as the phrase "at least one of X, Y, and Z," unless specifically stated otherwise, should also be understood to mean X, Y, Z, or any combination thereof, including "X, Y, and/or Z."

The systems and methods described herein are not limited to the specific embodiments described herein, but rather, components of the systems and/or steps of the methods may be utilized independently and separately from other components and/or steps described herein.

Although specific features of various embodiments of the disclosure may be shown in some drawings and not in others, this is for convenience only. In accordance with the principles of the disclosure, any feature of a drawing may be referenced and/or claimed in combination with any feature of any other drawing.

This written description uses examples to provide details on the disclosure, including the best mode, and also to enable any person skilled in the art to practice the disclosure, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A socket assembly for a semiconductor integrated circuit (IC) chip, comprising:
   a socket frame including a metallic frame body defining an opening sized to receive the semiconductor IC chip, wherein the frame body includes one or more channels transversely positioned through the frame body and positioned in an interior of the frame body, the channels defining a fluid path; and
   a socket cartridge including a metallic cartridge body defining a plurality of cavities each sized to receive a test probe therein, the socket frame covering a portion of the socket cartridge and exposing the plurality of cavities at the opening.

2. The socket assembly of claim 1, further comprising:
   an inlet coupled to the socket frame at a beginning of the fluid path; and
   an outlet coupled to the socket frame at an end of the fluid path.

3. The socket assembly of claim 1, wherein the socket frame includes one or more plugs each positioned at an exterior of the socket frame and at an end of one of the channels.

4. The socket assembly of claim 1, wherein the socket frame and the socket cartridge are fabricated as a single piece.

5. The socket assembly of claim 1, further comprising thermal paste positioned between the socket frame and the socket cartridge.

6. The socket assembly of claim 1, wherein the socket frame further comprises a first insulation layer positioned at a surface of the frame body except at a side interfacing with the socket cartridge, the socket cartridge further comprises a second insulation layer positioned at a surface of the cartridge body except at a side interfacing with the socket frame.

7. The socket assembly of claim 6, wherein the cavities include ground cavities that are not insulated.

8. The socket assembly of claim 6, wherein the cavities include signal cavities that are not insulated.

9. A method of assembling a socket assembly for a semiconductor integrated circuit (IC) chip, comprising:
   forming a socket frame including a metallic frame body that defines an opening sized to receive the semiconductor IC chip, wherein the frame body includes one or more channels transversely positioned through the frame body and positioned in an interior of the frame body, the channels defining a fluid path;
   forming a socket cartridge including a metallic cartridge body that defines a plurality of cavities each sized to receive a test probe therein; and
   mounting the socket frame on the socket cartridge by covering a portion of the socket cartridge and exposing the plurality of cavities at the opening.

10. The method of claim 9, wherein forming a socket frame further comprises:
    drilling one of the channels from an exterior of the socket frame; and
    joining the channels to form the fluid path.

11. The method of claim 9, further comprising:
    coupling an inlet with the socket frame at a beginning of the fluid path; and
    coupling an outlet with the socket frame at an end of the fluid path.

12. The method of claim 9, wherein forming a socket frame further comprises positioning a plug at an exterior of the socket frame and at an end of one of the channels.

13. The method of claim 9, wherein forming a socket cartridge further comprises forming the socket frame and the socket cartridge as a single piece.

14. The method of claim 9, wherein mounting the socket frame further comprises placing thermal paste on at least one of the socket frame or the socket cartridge.

15. The method of claim 9, wherein:
    forming a socket frame further comprises coating the socket frame with a first insulation layer;
    forming a socket cartridge further comprises coating the socket cartridge with a second insulation layer;
    removing the first insulation layer of the socket frame at a side interfacing with the socket cartridge;
    removing the second insulation layer of the socket cartridge at a side interfacing with the socket frame; and
    mounting the socket frame further comprises mounting the socket frame on the socket cartridge by facing the interfacing side of the socket frame and the interfacing side of the socket cartridge with one another.

16. The method of claim 15, wherein the cavities include ground cavities that are not insulated.

17. The method of claim 15, wherein the cavities include signal cavities that are not insulated.

* * * * *